US009923060B2

(12) United States Patent
Deliwala et al.

(10) Patent No.: US 9,923,060 B2
(45) Date of Patent: Mar. 20, 2018

(54) GALLIUM NITRIDE APPARATUS WITH A TRAP RICH REGION

(71) Applicant: Analog Devices, Inc., Norwood, MA (US)

(72) Inventors: Shrenik Deliwala, Andover, MA (US); James Fiorenza, Carlisle, MA (US); Donghyun Jin, Medford, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 15/165,122

(22) Filed: May 26, 2016

(65) Prior Publication Data

US 2016/0351666 A1    Dec. 1, 2016

Related U.S. Application Data

(60) Provisional application No. 62/168,473, filed on May 29, 2015.

(51) Int. Cl.

| | | |
|---|---|---|
| H01L 29/20 | (2006.01) |
| H01L 21/02 | (2006.01) |
| H01L 21/322 | (2006.01) |
| H01L 21/324 | (2006.01) |
| H01L 21/205 | (2006.01) |
| H01L 21/268 | (2006.01) |
| H01L 29/15 | (2006.01) |

(Continued)

(52) U.S. Cl.
CPC ........ *H01L 29/155* (2013.01); *H01L 21/0254* (2013.01); *H01L 21/02381* (2013.01); *H01L 21/02458* (2013.01); *H01L 21/02686* (2013.01); *H01L 21/3221* (2013.01); *H01L 29/2003* (2013.01); *H01L 29/205* (2013.01); *H01L 21/02507* (2013.01); *H01L 21/324* (2013.01); *H01L 29/7787* (2013.01)

(58) Field of Classification Search
CPC ................................................. H01L 29/66462
See application file for complete search history.

(56) References Cited

U.S. PATENT DOCUMENTS

| | | | |
|---|---|---|---|
| 6,113,685 A | 9/2000 | Wang et al. | 117/3 |
| 6,261,931 B1 | 7/2001 | Keller et al. | 438/492 |
| 7,247,889 B2 | 7/2007 | Hanson et al. | 257/189 |

(Continued)

FOREIGN PATENT DOCUMENTS

| | | | |
|---|---|---|---|
| CN | 103646961 A | 3/2014 | H01L 29/20 |

OTHER PUBLICATIONS

Umeda, Hidekazu, et al. "Blocking-voltage boosting technology for GaN transistors by widening depletion layer in Si substrates." Electron Devices Meeting (IEDM), 2010 IEEE International. IEEE, 2010.*

(Continued)

*Primary Examiner* — Victor A Mandala
*Assistant Examiner* — Regan J Rundio
(74) *Attorney, Agent, or Firm* — Schwegman Lundberg & Woessner, P.A.

(57) ABSTRACT

A method cold-melts a high conductivity region between a high-resistivity silicon substrate and a gallium-nitride layer to form a trap rich region that substantially immobilizes charge carriers in that region. Such a process should substantially mitigate the parasitic impact of that region on circuits formed at least in part by the gallium-nitride layer.

25 Claims, 8 Drawing Sheets

(51) Int. Cl.
*H01L 29/205* (2006.01)
*H01L 29/778* (2006.01)

(56) References Cited

U.S. PATENT DOCUMENTS

| | | | |
|---|---|---|---|
| 7,598,108 B2 | 10/2009 | Li et al. ............................ 438/48 |
| 8,872,227 B2 | 10/2014 | Umeda et al. ................. 257/192 |
| 2007/0032040 A1* | 2/2007 | Lederer ............. H01L 21/76254 |
| | | | 438/455 |
| 2008/0315255 A1 | 12/2008 | Maa et al. ..................... 257/190 |
| 2012/0068189 A1 | 3/2012 | Hite et al. ........................ 257/76 |
| 2012/0211759 A1* | 8/2012 | Liu ................... H01L 21/02381 |
| | | | 257/76 |
| 2012/0326215 A1* | 12/2012 | Srivastava .......... H01L 29/0657 |
| | | | 257/288 |
| 2013/0084689 A1* | 4/2013 | Arriagada ......... H01L 21/02365 |
| | | | 438/478 |
| 2014/0167114 A1* | 6/2014 | Derluyn .............. H01L 29/0649 |
| | | | 257/194 |
| 2015/0145105 A1 | 5/2015 | Haapalinna |

OTHER PUBLICATIONS

Yamaguchi, Yutaro, et al. "Physical Model of RF Leakage in GaN HEMTs on Si Substrates Based on Atomic Diffusion Analysis at Buffer/Substrate Interface." Compound Semiconductor Integrated Circuit Symposium (CSICS), 2016 IEEE. IEEE, 2016.*

Lin, Kung-Liang, et al. "Growth of GaN film on 150 mm Si (111) using multilayer Al N/Al Ga N buffer by metal-organic vapor phase epitaxy method." Applied Physics Letters 91.22 (2007): 222111.*

Hageman et al., "High Quality GaN Layers on Si(111) Substrates: AlN Buffer Layer Optimisation and Insertion of a SiN Intermediate Layer", Physica Status Solidi (a) vol. 188, No. 2, p. 523-526, 2001.

Jang et al., "High-quality GaN/Si (1 1 1) epitaxial layers grown with various $Al_{0.3}Ga_{0.7}N$/GaN superlattices as intermediate layer by MOCVD," Journal of Crystal Growth, vol. 253, Issues 1-4, pp. 64-70, Mar. 23, 2003.

International Searching Authority, International Search Report—International Application No. PCT/US2016/034240, dated Sep. 8, 2016, together with the Written Opinion of the International Searching Authority, 13 pages.

Callan, J. Paul, et al., "Ultrafast Electron and Lattice Dynamics in Semiconductors at High Excited Carrier Densities," *Chemical Physics*, vol. 241, pp. 167-179, 2000.

Hageman, P.R., et al., "High Quality GaN Layers on Si(111) Substrates: AlN Buffer Layer Optimisation and Insertion of a SiN Intermediate Layer," *Phys. Stat. Sol.*, vol. 188, No. 2, pp. 523-526, 2001.

Nakamura, S., "GaN Growth Using GaN Buffer Layer," *Japanese Journal of Applied Physics*, vol. 30, No. 10A, pp. L1705-L1707, Oct. 1991.

Pattison, et al., "Improvising GaN on Si Power Amplifiers Through Reduction of Parasitic Conduction Layer," *Proceedings of the 9th European Microwave Integrated Circuits Conference*, pp. 92-95, 2014.

Phys.org, "Panasonic Develops Gallium Nitride (GaN) Power Transistor on Silicon with Blocking-Voltage-Boosting Structure," cited in http://phys.org/news/2010-12-panasonic-gallium-nitride-gan-power.html 3 pages, Dec. 8, 2010.

* cited by examiner

GALLIUM NITRIDE APPARATUS WITH A TRAP RICH REGION

PRIORITY

The Present United States Patent Application claims priority from U.S. Provisional Application No. 62/168,473 filed on May 29, 2015, which is incorporated herein by reference in its entirety.

FIELD OF THE INVENTION

The invention generally relates to gallium nitride electronic devices and, more particularly, the invention relates to forming gallium nitride electronic devices with mitigated parasitics.

BACKGROUND OF THE INVENTION

Electronic devices formed from a gallium nitride layer epitaxially grown on a high resistivity silicon substrate naturally form a high conductivity layer at the gallium nitride/silicon interface. As the gallium nitride or an aluminum nitride layer is epitaxially grown, high temperatures are applied to the silicon. As a result, the epitaxially grown layer can diffuse into the silicon and thereby dope the silicon causing the resistivity of the silicon to decrease. For example, as shown in FIG. 1 during growth of a AlGaN supperlattice or graded buffer on a silicon substrate, the Al and Ga can act as p-type dopants forming a doped Si region.[1] The decrease in the resistivity is caused by the appearance of free charge at the boundary between the two materials. Those skilled in the art often refer to this high conductivity layer as an "inversion layer." The inversion layer which acts as a conductor, undesirably electromagnetically couples with circuits of the gallium nitride layer, effectively forming a significant source of power loss and noise in the system.

[1] Pattison et al, Improving GaN on Si Power Amplifiers through reduction of parasitic conduction layer, Proceeding of the 9th European Microwave Integrated Circuits Conference (Oct. 7, 2014)

The parasitic conduction layer is represented by a resistance termed Rbuffer and the value of Rbuffer being dependant on the depth and doping concentration of the Si substrate. Additionally, capacitive coupling can be seen between the GaN, buffer, and Si layers.

The RF performance of such an electronic device consequently often is determined by the nature of the inversion layer. Specifically, the inversion layer can effectively short circuit at certain RF frequencies by capacitively coupling to circuits in the gallium nitride layer.

SUMMARY OF THE INVENTION

In accordance with one embodiment of the invention, a method is described that destroys the crystalline lattice structure of the silicon at the boundary in a very thin layer without affecting lattice at any other location. It is well known that the disordering of the lattice generates traps that prevent the charges from moving freely and would destroy the inversion layer. But this often requires the lattice to be brought very close to the melting temperature, something that would completely change the properties of all of the other layers. Provided herein is the description of a method to cold-melt the high conductivity boundary region between a high-resistivity silicon substrate and a gallium-nitride layer to form a trap rich region that substantially immobilizes charge carriers in that region so that any electrons within the region are isolated due to bonds in the lattice structure being broken. Such a process should substantially mitigate the parasitic impact of that region on circuits formed at least in part by the gallium-nitride layer. Alternatively, the GaN layer could more broadly be a Group III-N layer, such as GaN, AlN, and InN.

To those ends, some embodiments include an electronic device having a silicon substrate and a GaN layer forming a circuit device. The substrate and GaN layer together form an interface. The device also has a trap region extending from the interface. The trap region is configured to substantially immobilize charge carriers at and proximate to the interface.

The device also may have buffer layer between the GaN layer and the silicon substrate in order to facilitate lattice matching. This buffer layer may be epitaxially grown using high temperatures in excess of 1000 degrees Celsius. The buffer layer may be formed from Aluminum Nitride (AlN). Other buffer layers may also be grown on the silicon substrate and the epitaxially growing process can cause the formation of the inversion layer. For example, there may be different combinations of aluminum, gallium, and nitrogen that can be used to form the buffer layer. The Aluminum Nitride may diffuse and dope a thin layer of the silicon reducing the resistivity of the silicon in that layer (forming an inversion layer) and increasing conductivity. Other manners of forming a buffer layer may be included in embodiments of the present invention including forming a laminate buffer layer, such as a super lattice laminate of multiple layers of AlN and GaN.

In addition, the trap region may extend into the silicon substrate beyond that of the inversion layer. Moreover, in certain embodiments of the invention, the silicon substrate may be formed from a high resistivity silicon.

In other embodiments, a method forms an electronic device by forming a buffer on a silicon substrate, (epitaxially) growing a GaN layer on the buffer and silicon substrate, and forming a trap region between the GaN and the silicon substrate. The trap region extends into the silicon substrate.

The method preferably forms the trap region by cold melting a portion of the silicon substrate using a laser. For example, the method may use a short laser pulse having a pulse width of no greater than about 20 picoseconds. Such a laser pulse can be generated at any wavelength, but for the purposes of illustration, we chose a wavelength at which GaN layers are transparent but the underlying silicon substrate is strongly absorptive. Thus the wavelength has to be greater than about 400 nanometers. Below 380 nm, GaN becomes strongly absorptive and the laser must deposit most of it energy in the Silicon-GaN interface rather than in the GaN. It is also desirable for the laser to have a strong absorption in Silicon and thus a laser wavelength close to 500 nm is preferable. In addition, in a manner similar to the above embodiment, the silicon substrate may include a high resistivity silicon wafer.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

FIG. 5 is a graph showing the relationship between absorption depth and electron density;

FIG. 6 is a graph showing the relationship between reflectance and electron density.

DESCRIPTION OF ILLUSTRATIVE EMBODIMENTS

In illustrative embodiments, a gallium-nitride ("GaN") electronic device forms a trap region to substantially trap charge carriers formed at the interface of the gallium nitride layer/buffer and its underlying silicon substrate (the "GaN/Si interface"). This trap region may extend into the silicon substrate, substantially immobilizing charge carriers in the region it encompasses. Details of illustrative embodiments are discussed below.

The RF performance of the GaN device often is determined by the inversion layer formed at the GaN/Si interface. As noted above, the inversion layer typically has free charge carriers that, due to its parasitic impact on the device, can reduce the signal-to-noise ratio of the device and/or the power efficiency of the device. The inversion layer can form part of a capacitor wherein the inversion layer acts as a first plate that is separated by a buffer layer from the GaN layer, which acts as a second plate in proximity to the buffer layer. Given that capacitive reactance is a function of the frequency, the performance of radio frequency and higher signals may be diminished by capacitive coupling. If a trap rich layer/region is formed, the RF performance can be significantly improved if the inversion layer is destroyed/eliminated or substantially mitigated. This can be done by adding a high degree of recombination centers defining a trap rich area/region. These recombination centers are such that minority carriers are captured and then recombined subsequently with captured majority carrier (i.e. electrons).

Accordingly, GaN devices on silicon substrates can be extended to 60 GHz or more for power and RF electronics. Some embodiments also apply to traditional RF SOI wafer manufacturing to avoid the step of polysilicon deposition.

Figure 1:
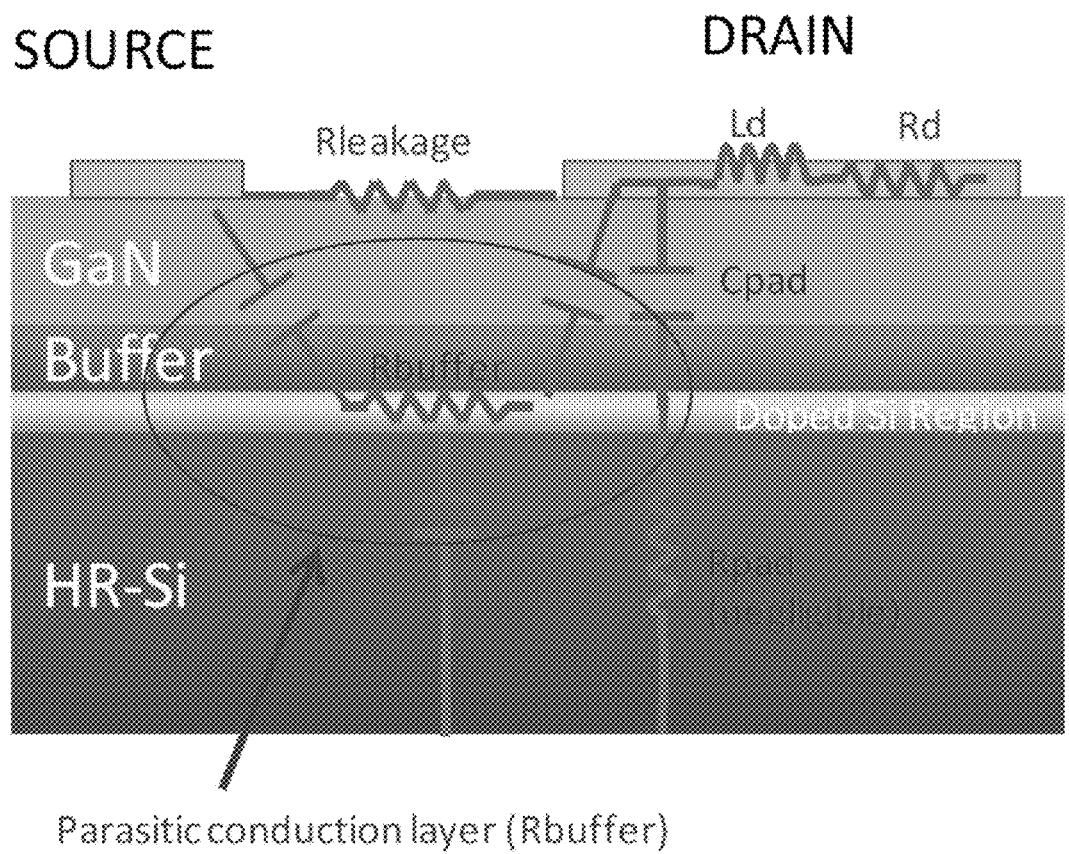
FIG. 1 shows an exemplary GaN device where an inversion layer is formed creating parasitic capacitive coupling.
Figure 2A:
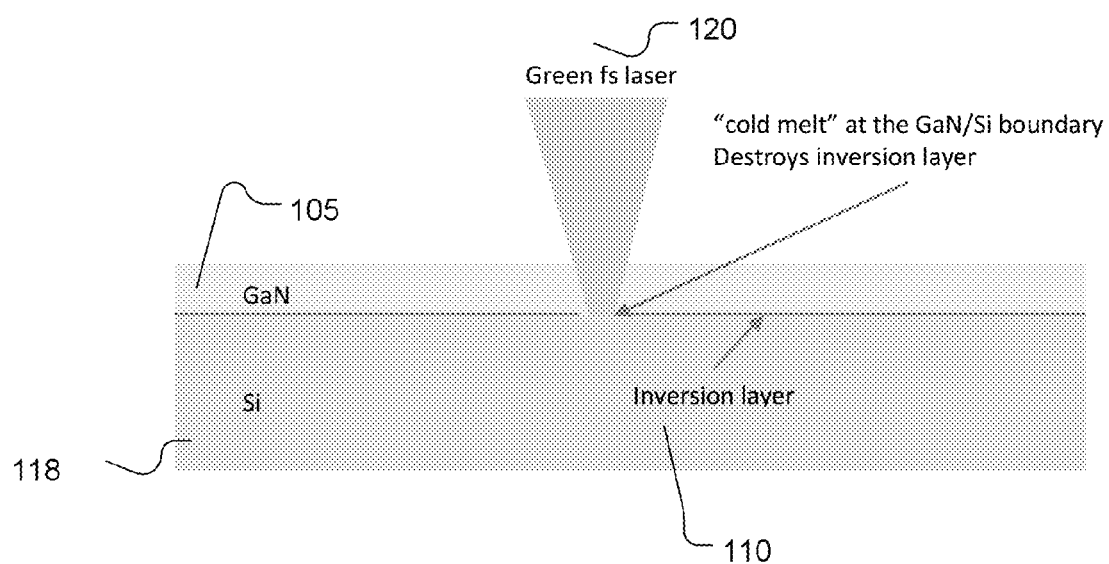
FIG. 2A schematically shows a cross-sectional view of a GaN device having an inversion layer that is applied with a femtosecond laser.

FIG. 2A schematically shows a cross-sectional view of a GaN device 100 having a GaN layer 105 formed on a silicon substrate 118. The GaN device having the noted thin inversion layer/region (i.e., before the inversion layer is processed, as discussed below) 110. Illustrative embodiments "cold melt" the thin inversion region with one or more short laser pulses 120 (e.g., pulse width<20 picoseconds) just at the GaN on silicon interface, forming a substantially inert trap region (also referred to as a "trap rich region") 130. Among other things, this trap region can encapsulate the inversion region, or just cover its top surface (from the perspective of the GaN layer in the drawings).

FIG. 2A also schematically shows a beam from a green femtosecond laser 120 at a wavelength of about 500 nm aimed at this region. More specifically, this process can be completed by irradiating the thin silicon interface layer through the GaN material, which is transparent at wavelengths above 400 nm. The lattice temperature of silicon consequently rises by <1 K and yet, the lattice becomes disordered—and increases the recombination rate—by high level of pumping of valence band electrons to the conduction band. This should prevent the inversion layer from forming and hence, the substrate continues to act as a high resistivity substrate.

Figure 2B:
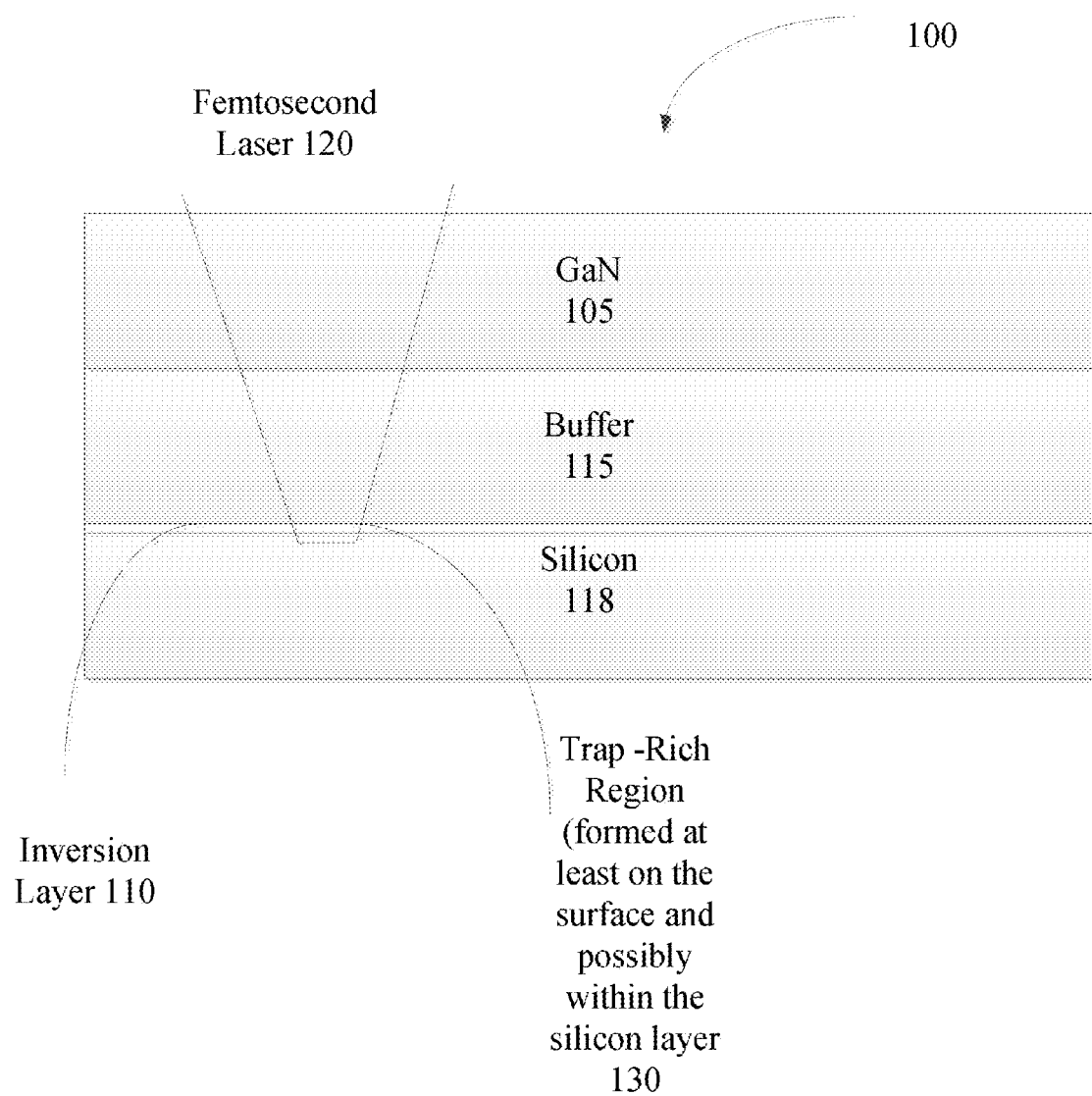
FIG. 2B schematically shows a cross-sectional view of a GaN device having a buffer layer and an inversion layer that is applied with a femtosecond laser.

The entire process may be carried out before a semiconductor fabrication facility receives the GaN/Si wafer for processing. In other words, this process can simply form a wafer having the high resistivity silicon substrate, the GaN layer, the buffer layer between the two layers (not shown in FIG. 2A, 115 in FIG. 2B, e.g., to compensate for stress, material islanding, and other issues between the two layers, such as lattice mismatch), the trap region, and other layers deemed necessary for the given application. The semiconductor fabrication facility can then form the circuitry as required.

The nucleation or buffer layer may be formed in a number of different ways known to those of ordinary skill in the art. For example, AN may be epitaxially grown on the silicon substrate. In other embodiments, multiple buffer layers are used. For example, GaN/AlN with superlattices can be grown on the silicon substrate. Other buffers and techniques for growing buffers are well known in the art, such as those disclosed in "GaN Growth using GaN Buffer Layer" by Nakamura, Japanese Journal of Applied Physics, Volume 30, Part 2, Number 10A (Japanese Journal of Applied Physics 1991); "Growth of GaN epilayers on Si(111) substrates using multiple buffer layers" by Hagemann et al, in Mat. Res Soc. Symp. Proc. Vol. 693 (Materials Research Society 2002), which is incorporated herein by reference in its entirety.

Figure 3:
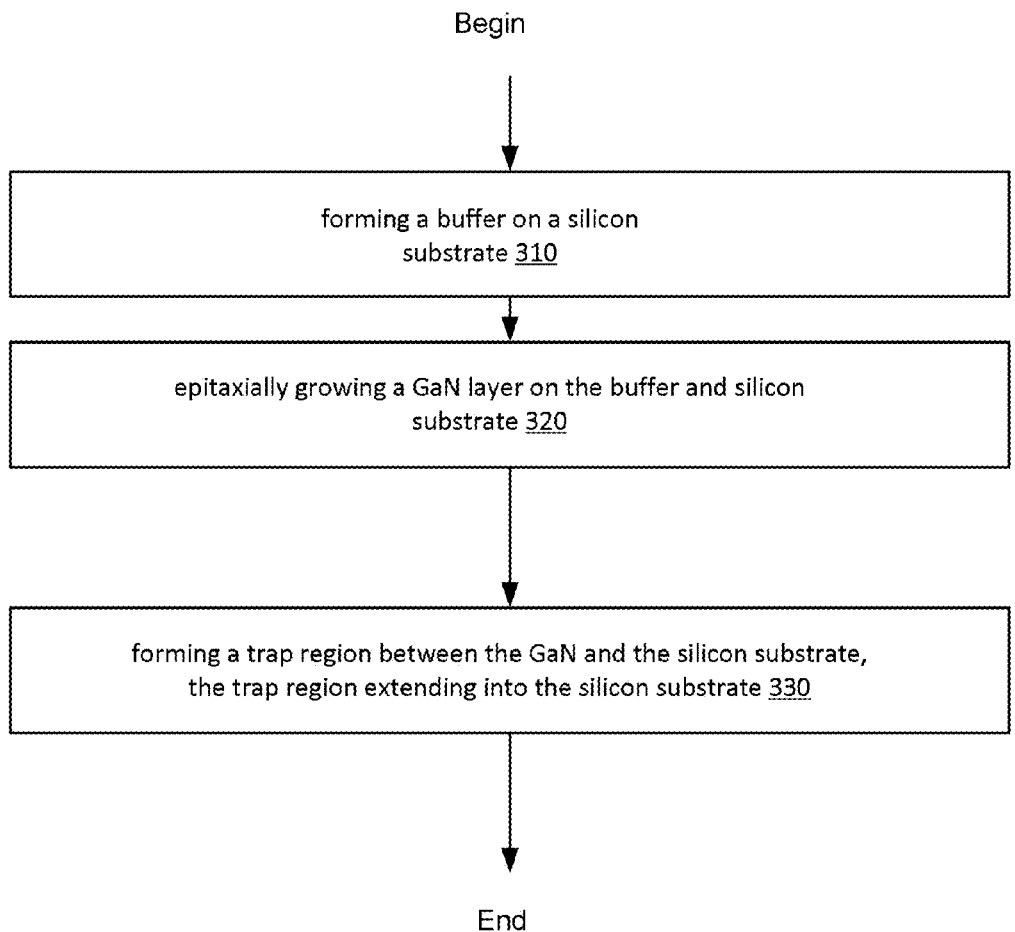
FIG. 3 is a flow chart describing the steps for creating a trap region to increase the resistivity of a silicon layer in one embodiment of the invention.

FIG. 3 is a flow chart describing the steps for creating a trap region to increase the resistivity of a silicon layer in one embodiment of the invention. First, a silicon wafer is provided. Using techniques known to one of ordinary skill in the art a buffer layer is epitaxially grown on the top surface of the silicon layer 310. This process requires high temperatures to be applied to the buffer layer, which can causes electrons to diffuse into the top surface of the silicon forming an inversion layer ("doped region/layer"). On top of the buffer layer, a GaN layer is epitaxially grown 320. To mitigate the inversion layer formed on and in the silicon layer, a trap region is formed between the GaN layer and the silicon substrate. The trap region can extend into the silicon substrate beyond the top surface of the silicon substrate. The trap region is formed by applying a laser of the proper frequency and power level through the GaN and buffer layers. The GaN and buffer layers appear transparent to the laser and thus, the energy of the laser does not focus until the silicon substrate. As discussed, the laser performs cold melting breaking down the lattice structure of the silicon such that any energetic particles are trapped within that region thus, increasing the resistance of the silicon.

Figure 4:
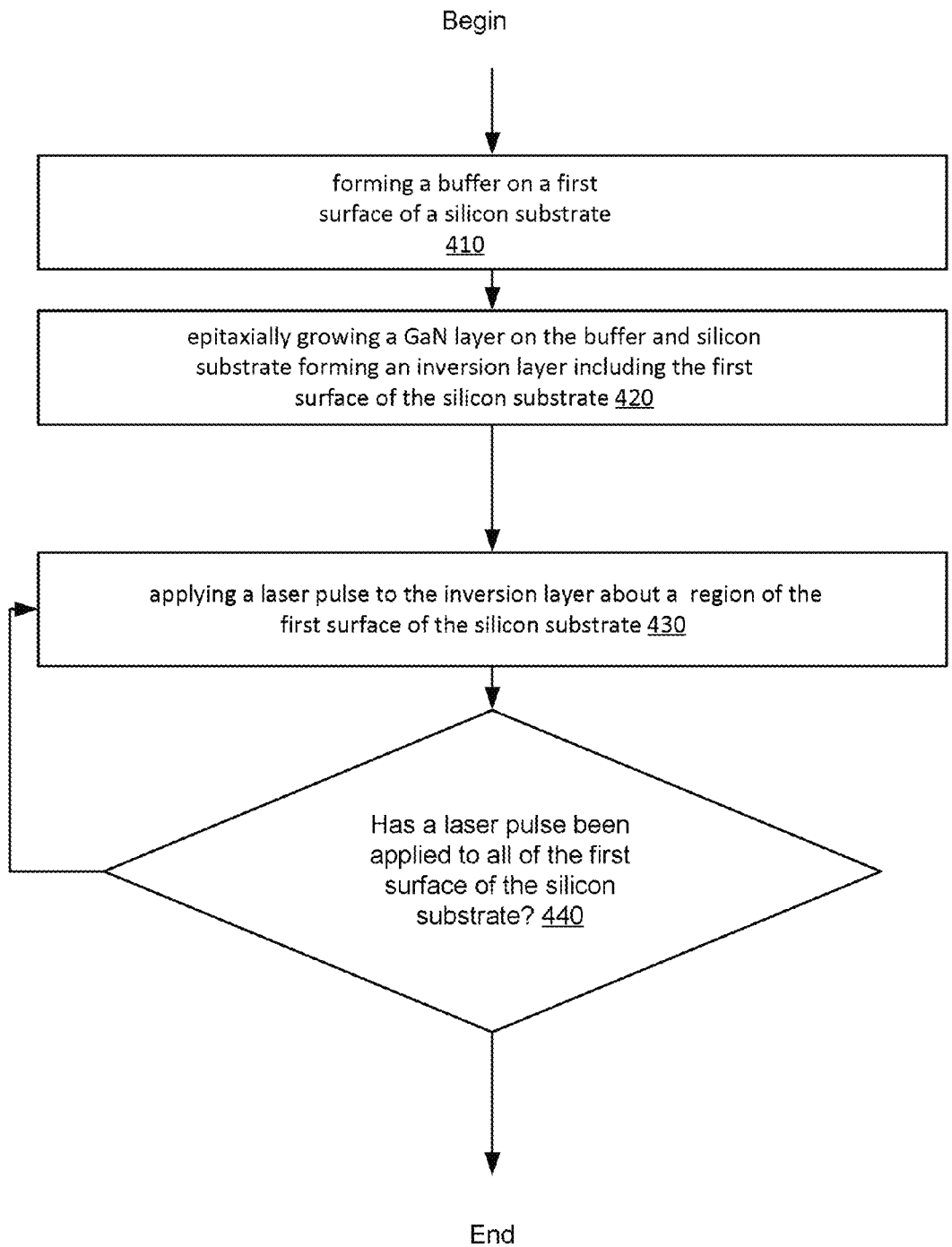
FIG. 4 is a flow chart explaining that the trap region may be formed by repeatedly applying the laser to different regions of the top surface of the silicon substrate.

FIG. 4 is a flow chart explaining that the trap region may be formed by repeatedly applying the laser to different regions of the top surface of the silicon substrate. As in FIG. 3, a buffer is formed on a first surface of the silicon substrate 410. A GaN layer is grown on the buffer layer and the silicon substrate causing the formation of an inversion layer. 420. A laser pulse is then applied to the inversion layer on a region of the first surface of the silicon substrate. 430. This process is repeated as indicated in 440 until all of the inversion layer formed along the buffer silicon boundary has been changed into a trap region.

The basic physics of the "cold melting" used by illustrative embodiments is described below. It should be noted, however, that such embodiments are for exemplary purposes only and thus, those in the art could us other techniques.

As noted, illustrative embodiments form the trap region by effectively "melting" silicon without lattice heating. This occurs because light absorption in a material proceeds by promoting an electron from the lower energy state—valence band—to the higher energy state—conduction band. For a molecule, and a crystal is just a giant molecule, promotion to the higher energy state is often the promotion to the anti-bonding orbitals, which in general causes atoms of the individual molecules to increase the equilibrium distance between them if they do not dissociate. If all the electrons in the valence band were suddenly promoted to a point high in the conduction band, then each of the silicon atoms are suddenly free to change their equilibrium lattice locations. These electrons relax to the bottom of the valence band in about 1-2 picoseconds and the propensity to be at a different equilibrium location disappears. Thus, illustrative embodiments can move the atoms from their equilibrium lattice locations by simply pumping most of the valence band electrons. Note that the change in the location occurs mostly due to the kinetic energy already present in the atoms at the time of laser excitation.

Typical vibrational kinetic energy of the lattice vibrations above the Debye temperature is:

$$3k_bT = \frac{1}{2}m<v^2>$$

This gives about 750 m/s at room temperature. Those in the art know that this is less than about the velocity of sound in the material. Thus, in 1 picosecond, the atoms may have the time to move around more freely just following the pumping by the laser—the atoms can move a distance of as much as 750 pm or 7.5 Å. Note that the silicon's lattice constant is 5.43 Å. Thus, one skilled in the art can effectively "melt" silicon based on the Lindemann's criteria for melting, which states that melting occurs when atoms are displaced from their lattice positions when they are displaced by about 0.2-0.4 of the lattice constant.

Note that the energy pumped into the electrons is very small compared to that required to heat the lattice substantially because lattice has very large specific heat. With this theoretical background, one can now estimate the laser fluence for the experiments.

Silicon has density n=5*10$^{22}$ atoms/cc.

Illustrative embodiments use a green 530 nm femtosecond laser. The absorption depth δ in Si for green wavelength about 0.9 micrometers. Thus, in order to pump at least one electron per silicon to the conduction band—and there are 4 valence band electrons/Si—one skilled needs:

$$F^* = n\left(\frac{\delta}{10}\right)(hv) = 0.2 \text{ J/cm}^2$$

Illustrative embodiments take advantage of the fact that absorption of only the top thin layer in the silicon whose thickness is δ/10 is all that is required and thus, such embodiments can approximate exponential decay with a constant absorption. As the laser light is absorbed, free electron density rises and the surface of the silicon should begin to look metallic to the light. This will reduce the absorption depth and increase the free carrier absorption. The conductivity of free electrons from the Drude theory is $$n^2 = \sqrt{\epsilon} = 1 - i\frac{\omega_p^2}{\omega^2 + i\omega\tau}, \text{ with } \omega_p^2 = \frac{N_e e^2}{m_e \epsilon_0} \text{ and } \tau \sim 1-10 fs$$

Figure 5:
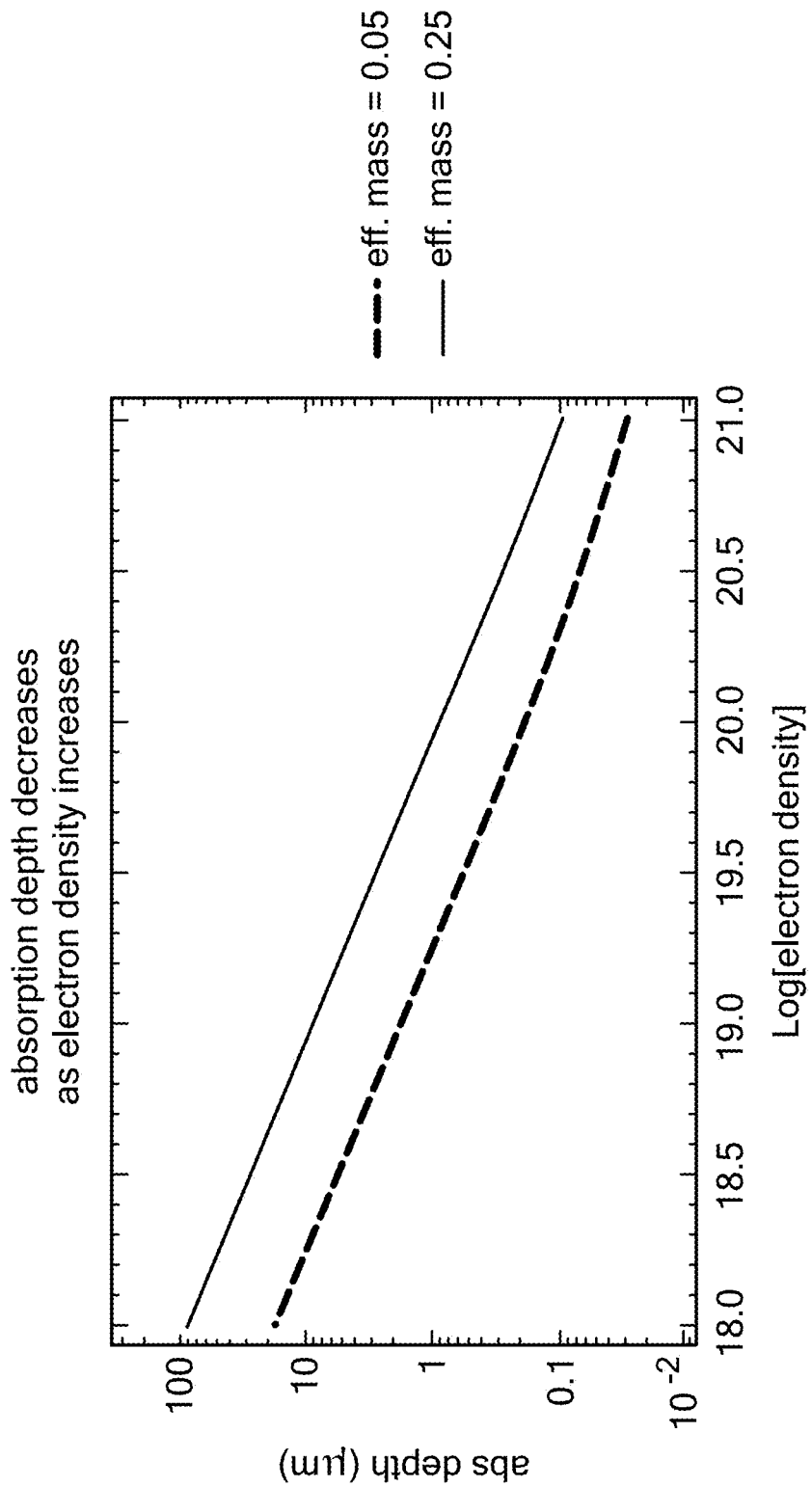
FIGS. 5 and 6 schematically show plots illustrating one method of forming a trap region in accordance with various embodiments of the invention.
Figure 6:
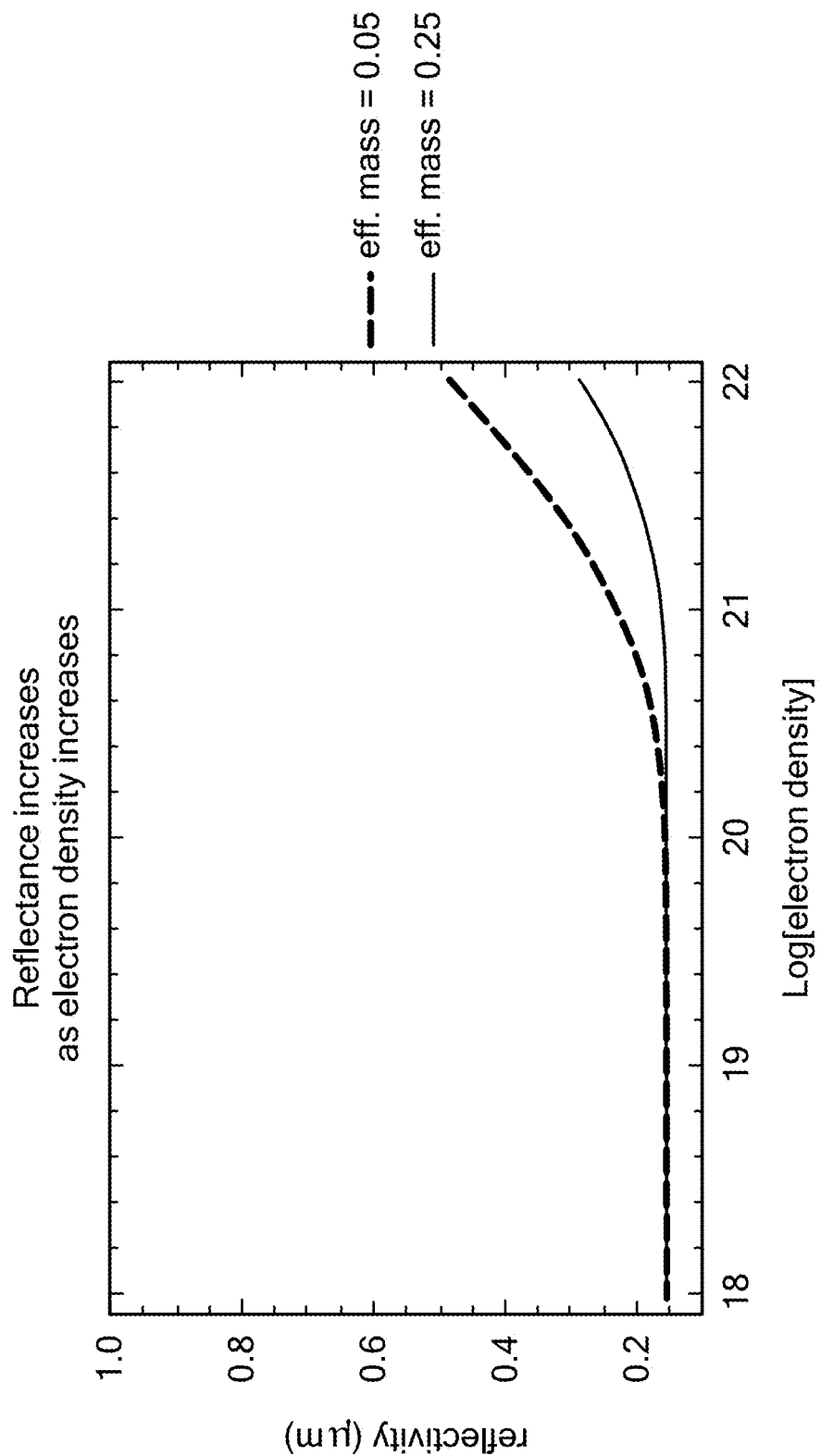

From the above equation, one skilled in the art can plot the expected absorption depth and reflectance as a function of free-carrier density. This is shown by the plots of FIGS. 5 and 6. FIG. 5 is a graph showing the relationship between absorption depth and electron density. FIG. 6 is a graph showing the relationship between reflectance and electron density. From the two plots of FIGS. 5 and 6, about 10$^{20}$/cc the absorption depth is less than the bulk absorption depth at 0.5 micrometers and the laser light does not reach deep into the substrate. At the same time, the electron plasma becomes highly reflective and becomes a poor absorber. Complex time domain dynamics can be modelled to understand the dynamic behavior and actual number of excited state electrons from the laser pulse of a given pulse width. Furthermore, acceleration of some of the free electrons can excite other electrons by Auger process etc. and thus the lattice dynamics. A sufficient disordering of the lattice, however, should accomplish various goals.

Thus, the actual critical fluence may be much less than the F* computed above. In fact, some research with infrared pumping suggests critical fluence of about 100 mJ/cm$^2$.

For a lattice disordered sufficiently to prevent inversion of the Si interface, the actual fluence may be in the regime of 1-100 mJ/cm$^2$. Of course, other embodiments may have an actual fluence that is different. It may be sufficient to destroy lattice order with one defect every 100 atoms or at some other distribution. This also follows from the mean free path of the electron/holes in Si.

For example, assume F$_d$ represents the actual fluence required to do the job. Thus a laser with total power P$_0$ with a repetition rate R, will be focused to spot size $$F_d \pi s^2 = \frac{P_0}{R}$$

One skilled in the art thus can estimate the rate of exposure, spot size, and cost for processing wafers in high volume.

Figure 7:
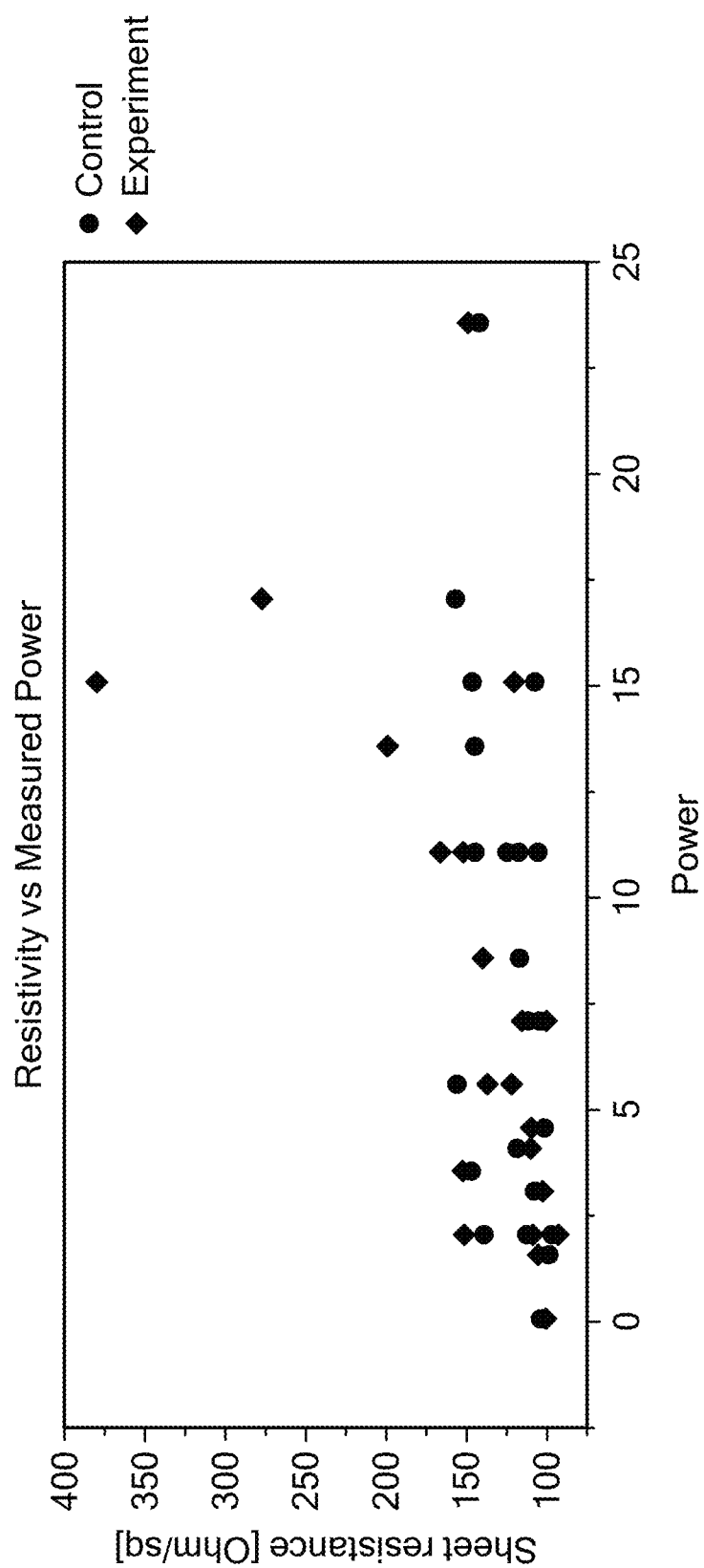
FIG. 7 is a graph showing test results in which the resistivity of silicon is increased when exposed to a femtosecond laser of the appropriate power level.

FIG. 7 is a graphical chart that confirms that a trap region is formed when an appropriate amount of supplied power is provided to a silicon substrate. As shown, when the applied power of the laser is between approximately 13 and 17 mW the sheet resistance of the silicon substrate increases by between 50 Ohms/Sq and 225 Ohms/Sq micrometer when compared to a control. In the experiment, the top half (50 micrometers) of a 100 micrometer thick silicon substrate was exposed to a 513 nanometer femtosecond laser. The bottom 50 micrometers were used as a control measurement. The increase in sheet resistance of the silicon substrate is the result of cold melting of the lattice bonds within the silicon.

Indeed, it should be reiterated that illustrative embodiments may use other techniques for forming the trap region. Accordingly, other embodiments may use other wavelengths, laser pulse speeds, instrumentation, etc. Moreover, rather than producing the trap region using a post-processing method (i.e., the GaN substrate is formed before processing), this process of forming the trap region in a pre-process method (e.g., before the GaN layer is added).

Although the above discussion discloses various exemplary embodiments of the invention, it should be apparent that those skilled in the art can make various modifications that will achieve some of the advantages of the invention without departing from the true scope of the invention.

We claim:

1. An electronic device having an inversion layer with reduced parasitic effects, the electronic device comprising:
    a silicon substrate;
    a GaN layer above the silicon substrate, the GaN layer forming a circuit device;
    an interface between the GaN layer and the silicon substrate; and
    a semiconductor trap region extending from the interface and into the silicon substrate, the trap region including traps respectively comprising one or more broken bonds in a crystalline lattice structure of the semiconductor trap region of the silicon substrate and the traps being configured to substantially immobilize charge carriers in the trap region.

2. The electronic device according to claim 1, wherein the silicon substrate comprises high resistivity silicon.

3. The electronic device according to claim 1, further comprising:
    a buffer layer between the GaN layer and the silicon substrate, wherein the interface is between the buffer layer and the silicon substrate.

4. The electronic device according to claim 3, wherein the buffer layer has a thermal expansion coefficient allowing for the GaN layer to be epitaxially grown.

5. The electronic device according to claim 3, wherein the buffer layer is formed from AlN.

6. The electronic device according to claim 3, wherein the buffer layer comprises a plurality of layers.

7. The electronic device according to claim 3, wherein the buffer layer is a superlattice.

8. The electronic device according to claim 7, wherein the superlattice is AlGaN/GaN.

9. The electronic device according to claim 1, wherein the semiconductor trap region is formed globally across a wafer providing the silicon substrate.

10. The electronic device according to claim 1, wherein the semiconductor trap region provides a higher sheet resistance than a region of the silicon substrate underlying the semiconductor trap region.

11. The electronic device of claim 10, wherein the semiconductor trap region provides a sheet resistance that is at least 50 Ohms/square higher than the region of the silicon substrate underlying the semiconductor trap region.

12. The electronic device of claim 10, wherein the semiconductor trap region provides a sheet resistance that is at least 225 Ohms/square higher than the region of the silicon substrate underlying the semiconductor trap region.

13. The electronic device of claim 10, wherein the semiconductor trap region provides a sheet resistance between 50 Ohms/square and 225 Ohms/square higher than the region of the silicon substrate underlying the semiconductor trap region.

14. The electronic device of claim 1, wherein the semiconductor trap region extends at least 50 micrometers into the silicon substrate from the interface between the GaN layer and the silicon substrate.

15. A method of forming an electronic device with reduced parasitic effects in an inversion layer, the method comprising:
    forming a buffer on a silicon substrate;
    epitaxially growing a GaN layer on the buffer and silicon substrate, and
    forming a semiconductor trap region between the GaN and the silicon substrate by cold melting a portion of the silicon substrate using a laser, the semiconductor trap region extending into the silicon substrate from an interface between the GaN layer and the silicon substrate.

16. The method according to claim 15, wherein forming the semiconductor trap region comprises:
    breaking one or more bonds in a crystalline lattice structure of the semiconductor trap region to form traps configured to substantially immobilize charge carriers in the trap region.

17. The method of claim 16 wherein, forming comprises:
    using a short laser pulse having a pulsewidth of no greater than 20 picosecond.

18. The method according to claim 17, wherein the laser pulse includes a wavelength greater than 380 nanometers.

19. The method according to claim 15, wherein the silicon substrate comprises a high resistivity silicon wafer.

20. The method according to claim 15, wherein forming the semiconductor trap region extending into the silicon substrate comprises using a laser providing a fluence of between 1 and 100 mJ/cm2.

21. An electronic device having an inversion layer with reduced parasitic effects, the electronic device comprising:
    a silicon substrate;
    a GaN layer above the silicon substrate, the GaN layer forming a circuit device;
    an interface between the GaN layer and the silicon substrate; and
    a means for using traps respectively including one or more broken bonds in a crystalline lattice structure of a semiconductor trap region and substantially immobilizing charge carriers and mitigating an inversion layer on at least the interface.

22. The electronic device according to claim 21, further comprising:
    a buffer layer between the GaN layer and the silicon substrate, wherein the interface is between the buffer layer and the silicon substrate.

23. The electronic device according to claim 21 wherein the means for substantially immobilizing charge carriers extends into the silicon substrate.

24. The electronic device according to claim 21, wherein the silicon substrate comprises high resistivity silicon.

25. The electronic device according to claim 22, wherein the buffer layer has a thermal expansion coefficient allowing for the GaN layer to be epitaxially grown.

* * * * *

UNITED STATES PATENT AND TRADEMARK OFFICE
CERTIFICATE OF CORRECTION

PATENT NO. : 9,923,060 B2
APPLICATION NO. : 15/165122
DATED : March 20, 2018
INVENTOR(S) : Deliwala et al.

Page 1 of 1

It is certified that error appears in the above-identified patent and that said Letters Patent is hereby corrected as shown below:

On the Title Page

On page 2, in Column 1, item (56) under "Other Publications", Line 6, delete "Al N/Al Ga N" and insert --AlN/AlGaN-- therefor On page 2, in Column 2, item (56) under "Other Publications", Line 3, delete "AIN" and insert --AlN-- therefor On page 2, in Column 2, item (56) under "Other Publications", Line 17, delete "AIN" and insert --AlN-- therefor In the Claims In Column 8, Line 9, in Claim 15, delete "substrate," and insert --substrate;-- therefor In Column 8, Line 25, in Claim 17, delete "picosecond." and insert --picoseconds.-- therefor In Column 8, Line 33, in Claim 20, delete "mJ/cm2." and insert --mJ/cm$^2$.-- therefor Signed and Sealed this
Twenty-fifth Day of June, 2019

Andrei Iancu
*Director of the United States Patent and Trademark Office*